(12) United States Patent
Walker et al.

(10) Patent No.: US 8,378,689 B2
(45) Date of Patent: Feb. 19, 2013

(54) ELECTROSTATIC SENSOR DEVICE AND MATRIX

(75) Inventors: James T. Walker, Palo Alto, CA (US); Christopher I. Walker, Pasadena, CA (US); Tony G. Tadin, Woodside, CA (US); Arjen Sundman, Lake Oswego, OR (US)

(73) Assignee: Amfit, Inc, Vancouver, WA (US)

( * ) Notice: Subject to any disclaimer, the term of this patent is extended or adjusted under 35 U.S.C. 154(b) by 130 days.

(21) Appl. No.: 12/836,365

(22) Filed: Jul. 14, 2010

(65) Prior Publication Data

US 2011/0140705 A1   Jun. 16, 2011

Related U.S. Application Data

(60) Provisional application No. 61/270,853, filed on Jul. 14, 2009.

(51) Int. Cl.
*G01R 31/02* (2006.01)
*G01R 29/22* (2006.01)

(52) U.S. Cl. ............................ 324/452; 324/72; 324/109

(58) Field of Classification Search .................... 324/72, 324/109, 452, 457
See application file for complete search history.

(56) References Cited

U.S. PATENT DOCUMENTS

| | | | |
|---|---|---|---|
| 4,152,748 A | 5/1979 | Arkans | 361/283 |
| 4,509,527 A | 4/1985 | Fraden | 128/671 |
| 4,562,430 A | 12/1985 | Robinson | 324/660 |
| 4,862,743 A | 9/1989 | Seitz | 73/172 |
| 4,972,154 A | 11/1990 | Bechtel et al. | 128/779 |
| 5,088,503 A | 2/1992 | Seitz | 128/779 |
| 5,430,381 A | 7/1995 | Dower | 324/452 |
| 5,449,002 A | 9/1995 | Goldman | 600/592 |
| 5,659,395 A | 8/1997 | Brown et al. | 356/376 |
| 5,678,448 A | 10/1997 | Fullen et al. | 73/172 |
| 5,729,905 A | 3/1998 | Mathiasmeier et al. | 33/3 R |
| 5,775,332 A | 7/1998 | Goldman | 128/774 |
| 5,790,256 A | 8/1998 | Brown et al. | 356/376 |
| 6,029,358 A | 2/2000 | Mathiasmeier et al. | 33/3 R |
| 6,033,370 A | 3/2000 | Reinbold et al. | 600/595 |
| 6,331,893 B1 | 12/2001 | Brown et al. | 356/601 |
| 6,525,547 B2 | 2/2003 | Hayes | 324/662 |
| 6,864,687 B2 | 3/2005 | Walker et al. | 324/452 |
| 6,878,554 B1 | 4/2005 | Schermer et al. | 436/180 |
| 7,019,529 B2 | 3/2006 | Walker et al. | 324/452 |
| 2005/0030042 A1 * | 2/2005 | Walker et al. | 324/452 |

\* cited by examiner

*Primary Examiner* — Melissa Koval
*Assistant Examiner* — Farhana Hoque
(74) *Attorney, Agent, or Firm* — Ohlandt, Greeley, Ruggiero & Perle, LLP

(57) ABSTRACT

An electrostatic sensor device including a first sensor element and a second sensor element; a dielectric substrate material formed in two layers, and a sensing hole which penetrates the dielectric substrate material from its upper surface to its lower surface. The first sensor element is receivable in the sensing hole; and second sensor element includes a first conducting ring disposed on an upper surface of said dielectric substrate and surrounding said sensing hole. The second conducting ring is disposed on a lower surface of the dielectric substrate and surrounds the sensing hole. The first sensor element and the second sensor are capable of producing a variable response when the first sensor element is disposed in the sensing hole.

12 Claims, 9 Drawing Sheets

ELECTROSTATIC SENSOR DEVICE AND MATRIX

CROSS-REFERENCE TO RELATED APPLICATIONS

This application claims benefit of U.S. Provisional Patent Application No. 61/270,853 filed on Jul. 14, 2009, which is incorporated by reference herein.

FIELD OF THE DISCLOSURE

The present invention relates to a system and device for measuring the contour or shape of an object using an array of electrostatic sensors.

BACKGROUND OF THE DISCLOSURE

There exist different approaches to determining the shape of an object. One prior approach is to use a magnetic head captive inside a gauge pin that is to be inserted into the receptacle or opening in a circuit board. One inside the openings, a group of pins serves to outline the shape or pattern being measured. Then, when a Hall effect sensor, which is mounted on the circuit board, moves along the length of the pins it determines the magnet's location and hence the pin's location.

The Hall effect technique, because it involves an expensive device for making measurements for the purpose described and requires quite exact alignment of the parts involved has serious limitations in use.

Other devices use an electrostatic sensor to detect a metal area on the gauge pin as it is translated through the circuit board. This has several advantages over the hall effect/magnetic head arrangement in that it uses a much less expensive sensor, has no critical alignment process, and simplifies the design and reduces the cost to manufacture the gauge pin. It however still requires that the electrostatic sensor be moved along the gauge pin's longitudinal axis.

Accordingly, it is desirable for a device to indicate the relative position of the gauge pin without having to move a sensor along its longitudinal axis. This would allow for a near instant indication of the gauge pin's location without all of the associated mechanical means required for the movement of the sensor.

SUMMARY OF THE DISCLOSURE

The present disclosure provides for a system for measuring the shape or pattern of objects electrostatically by having an array of sensor devices formed in a circuit board. Such sensor devices have the capability of responding differentiatedly to input signals based upon the relative position of a sensor element at a particular location in the sensor device.

In a particular embodiment, the sensor device includes: A dielectric substrate material formed in two layers with a conducting plane between the two layers; a sensing hole which penetrates the dielectric substrate material from one outside surface to the other; a clearance hole in conducting plane such that the conducting plane does not obstruct the sensing hole; a conducting ring surrounding the sensing hole on each surface of the dielectric substrate and a sensor pin that moves within the sensing hole. The sensor pin disposed within the sensing hole has a shaped conductive region or pattern whose position is detected by the sensor to provide a relative indication of the sensor pin's position. The shaped region is a region in which conductive material does not completely cover the surface of the pin to form a thin conductive layer. The shaped conductive zone of sensor pin provides a non-constant response and a greater range of measurement of the surface to be measured and a proportional signal that is indicative of the amount of conductive material within sensing hole.

An electrostatic sensor device including a first sensor element and a second sensor element; a dielectric substrate material formed in two layers, and a sensing hole which penetrates the dielectric substrate material from its upper surface to its lower surface. The first sensor element is receivable in the sensing hole; and second sensor element includes a first conducting ring disposed on an upper surface of said dielectric substrate and surrounding said sensing hole. The second conducting ring is disposed on a lower surface of the dielectric substrate and surrounding the sensing hole wherein the first sensor element and the second sensor are capable of producing a variable response when the first sensor element is disposed in the sensing hole.

A system for electrostatically measuring the shape or pattern of objects includes an array of sensor devices including sensor device pairs. Each of the sensor device pairs includes a first sensor element and a second sensor element. The array of sensor devices has the capability of responding, due to variable electrostatic coupling, to produce differentiated output signals when the first sensor element of each of the sensor device pairs are at varying positions relative to the second sensor element of the sensor device pairs. The array includes M rows and N columns of sensor devices; a source of drive pulses connected to the M rows; a detector for determining that a pulse has occurred on one of the M input rows; a clock generator connected to the detector; sense amplifiers in the N columns for sensing the output signals from the sensor devices; and an amplitude reference generator connected to the M rows for providing a reference voltage such that if the reference value is exceeded, the respective sense amplifier output is stored The first sensor elements of the sensor device include shaped conductive zones.

The foregoing and still further objects and advantages of the present invention will be more apparent from the following detailed explanation of the preferred embodiments of the invention in connection with the accompanying drawings:

DETAILED DESCRIPTION OF THE DISCLOSURE

Figure 1A:
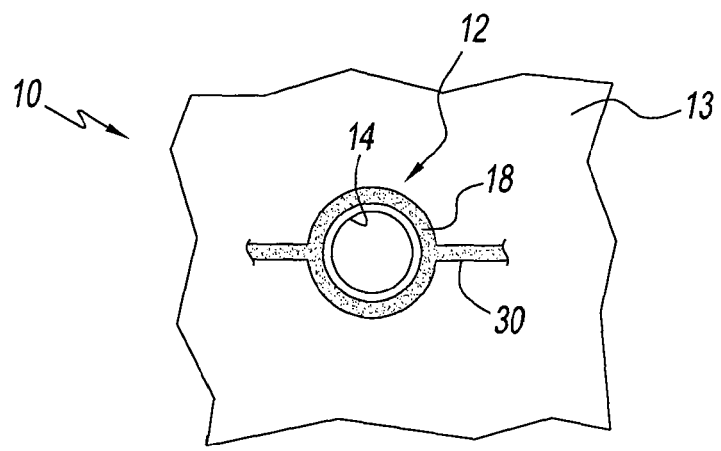
FIG. 1A is a top view of a sensor element formed in a dielectric printed circuit board.
Figure 1B:
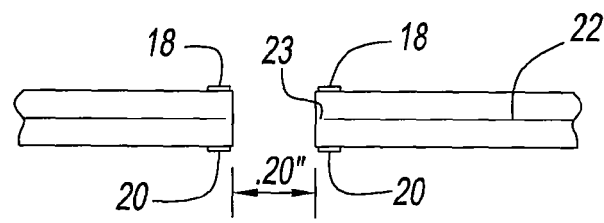
FIG. 1B is a side view of the sensor element.
Figure 1C:
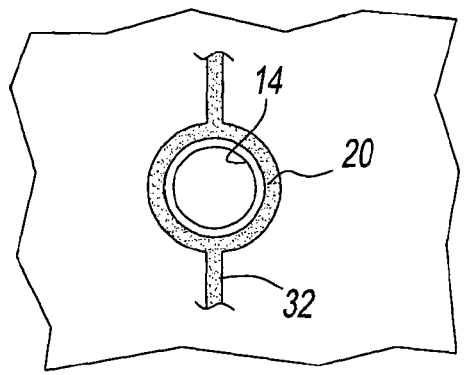
FIG. 1C is a bottom view of the sensor element.
Figure 1D:
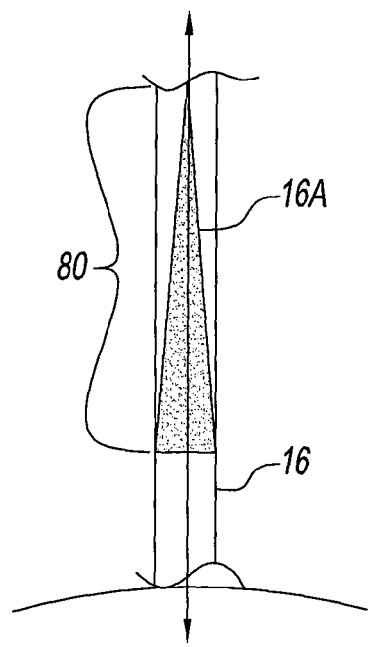
FIG. 1D is a diagram depicting a sensor element being sensed.

Referring now to the Figures of the drawing and particularly for the moment to FIG. 1, there will be seen an electrostatic system 10 for measuring the shape or pattern of an object by sensing the location of gauge pins or the like.

The system of sensor devices 12 is conveniently fabricated in a printed circuit board matrix by employing standard fabrication facilities to produce spaced openings or sense holes 14 for receiving the selectively inserted sensing elements, for example, in the form of pins 16. Arranged with specially designed parts, sense hole 14 functions as cooperative sensor elements with pins 16. Thus, an etched metal drive ring 18 surrounds the upper end of each sensing hole 14 in the circuit board (FIG. 1A), (the ring having, for example, 0.290 OD and 0.230 ID in inches. Likewise, an etched metal sense ring 20 surrounds the lower end of each sense hole 14.

Figure 7:
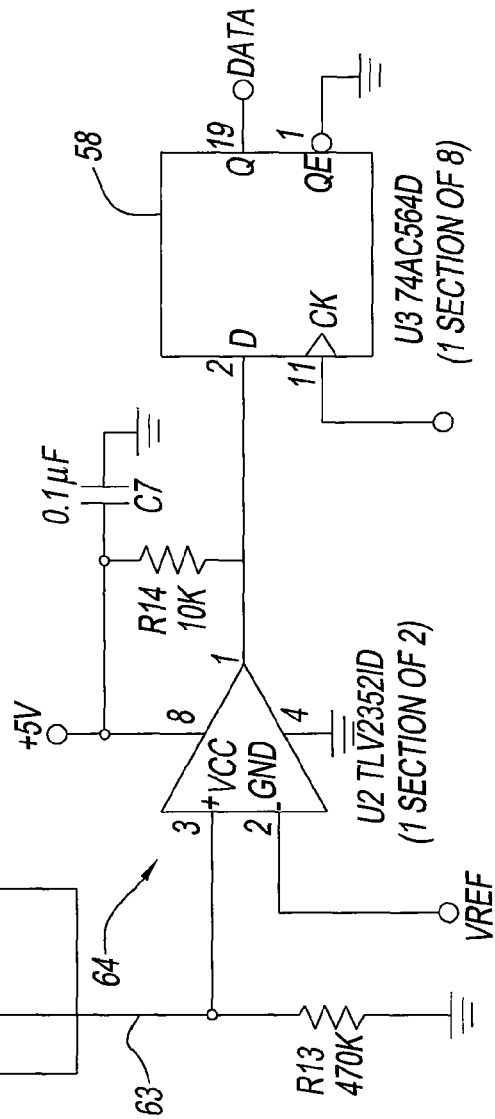
FIG. 7 is a schematic diagram of a sense amplifier and latch seen in FIG. 2.

It will be seen that a trace connection 30 (FIG. 1A) for operation of the system extends from the sense ring 18 to a suitable pulse drive source (FIG. 4), while a trace connection 32 (FIG. 1C) extends to a suitable sensing circuit (FIG. 7). Each of the sense rings 18 and 20 would preferably be formed to have a width of approximately 0.030 inches. For such drive rings 18, a sense hole 14 would have a 0.200 inch diameter and a 0.125 inch thick printed circuit board.

It will be appreciated that a sensor device 12 outputs a signal coupled by the capacitance between the two etched metal rings 18 and 20, as coupled through the dielectric printed circuit board 13, and pin 16 (FIG. 10), placed in sense hole 14. For the dimensions given, the output signal will change by an amount proportional to the amount of shaped conductive pattern 16*a* formed on shaped conductive zone 80 of pin 16 (FIG. 10) in sense hole 14. Amount of conductive material on shaped conductive zone 80 of pin 16 can be correlated to height of pin 16 of FIG. 10. This signal change can be sensed by a sensitive amplifier or comparator, and the result stored in a memory element for later use, as will be shown and explained in an embodiment. The shaped conductive pattern does not cover entire surface of pin and thus provides only partial metal coverage, to a produce a proportional reduced partial response output signal. Were surface of pin completely covered by a conductive material in conductive zone, the response output signal would be constant and a proportional response would not be produced. Shaped conductive pattern 16*a* can have a variety of shapes, in addition to the triangular shape shown in the figures.

Operation of the electrostatic sensor system begins with a drive pulse being used to excite the etched metal drive ring 18 on the top surface of the sensor area and surrounding the hole or sensing hole 14. Metal drive ring 18 is fabricated to have a small clearance, such as 0.015 inch, all around the hole drilled through the printed circuit board. This small clearance prevents direct contact between a conductive cylinder and the ring, for more repeatable performance. The trace connection 30 on the top surface of the printed circuit board connects metal drive ring 18 to a source of drive pulses, and to additional rings if desired. As seen in the side view (FIG. 1B) of the printed circuit board 13, the ring is fabricated over a metal ground plane (shield layer 22) buried in the middle of the printed circuit board's thickness. The ground plane has a clearance hole 23, already noted, surrounding sense hole 14. The clearance hole is drilled through the printed circuit board, so it cannot directly touch the metal cylinder that is intended to be placed in the center of the sense hole 14.

The bottom of the circuit board has a similar sense ring 20, used for sensing the amount of drive signal coupled by the electrostatic capacitance between the shaped conductive pattern 16*a* (FIG. 10) and the drive signal ring. A small capacitance exists between the shaped conductive pattern 16*a* and each ring, 18 and 20, passing predominantly through the dielectric material and the air gap around the shaped conductive pattern 16*a*. A small amount of additional coupling occurs directly in the air above rings 18 and 20 to the shaped conductive pattern 16 on each side of the printed circuit board. Note that sense ring 20 has a small clearance around the drilled hole, such as 0.015 inch as before. A trace connection 30 on the bottom surface connects sense ring 20 to a sense amplifier for monitoring coupled pulses, and additional rings if desired.

When the center of the drilled sensing hole 14 is empty, there is still a small amount of coupling through the hole between the drive and sense rings. As an example, for the dimensions given and in a matrix array of 36 columns by 16 rows, the residual signal with a 10-volt drive pulse will be about 10 millivolts. If now the hole is filled with a 0.18 inch diameter metal pattern on a dielectric support, such a pin 16 with a shaped conductive zone 80, the signal received by sense ring 20 will increase in an amount proportional to the amount of conductive material in sense hole 14. This signal increase, that covers a range of values of millivolts depending upon the position of the shaped conductive zone 80 in sense hole 14 provides for reliable sensing of the position of pin 16 in sense hole 14. The signal can be as much as 60 millivolts for 100% metal coverage. When sense hole 14 is partially filled with a dielectric of 0.18 inch outside diameter, the signal received will increase to about 20 millivolts. Thus the ratio of signal amplitudes between shaped conductive pattern 16*a* and dielectric is sufficient for reliable detection as before. Partial entry of the shaped conductive pattern 16*a* into the sensing hole 14 produces a corresponding analog response, and the subsequent signal processing amplifier will make the distinction of how much signal is needed to produce a digital output. If the grounded shield plane in the center of the printed circuit board thickness is omitted, the stray coupling between the drive and sense rings increases greatly, and there is insufficient signal variation for reliable sensing.

Figure 8A:
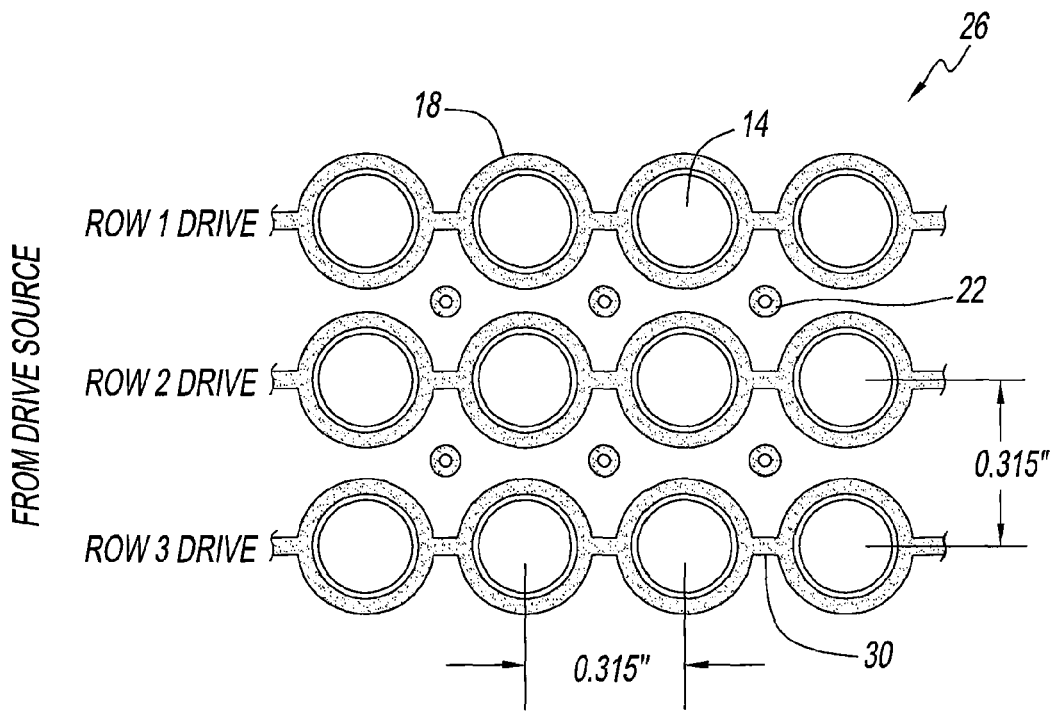
FIG. 8A is a top view of the sensor element array.
Figure 8B:
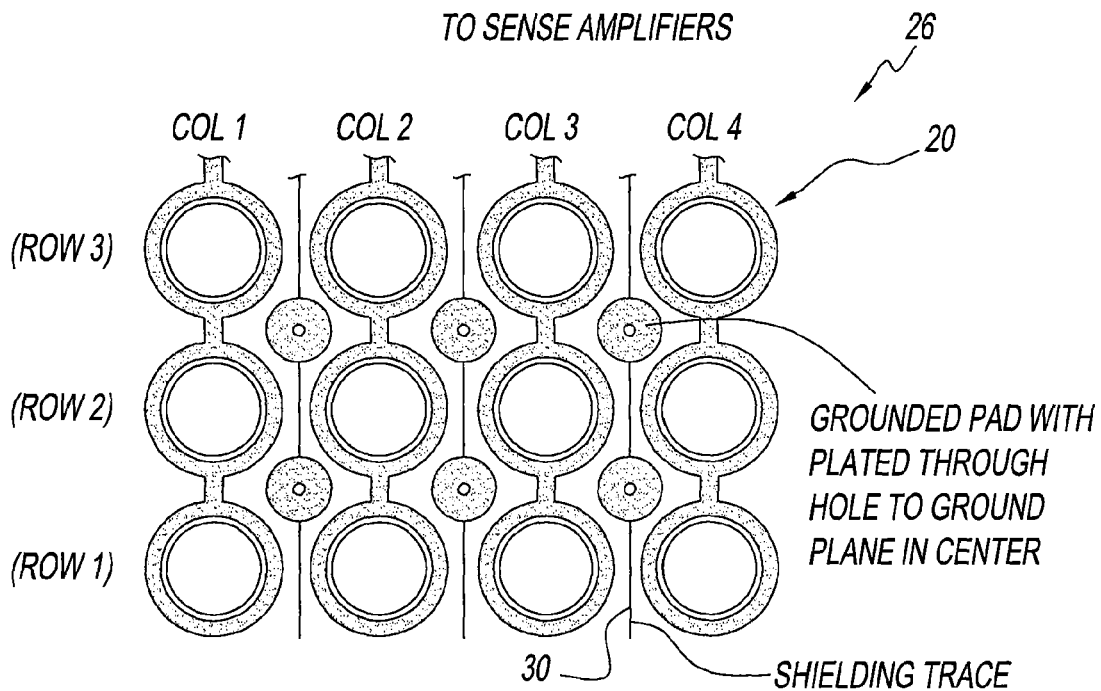
FIG. 8B is a bottom view of the sensor element array.
Figure 11:
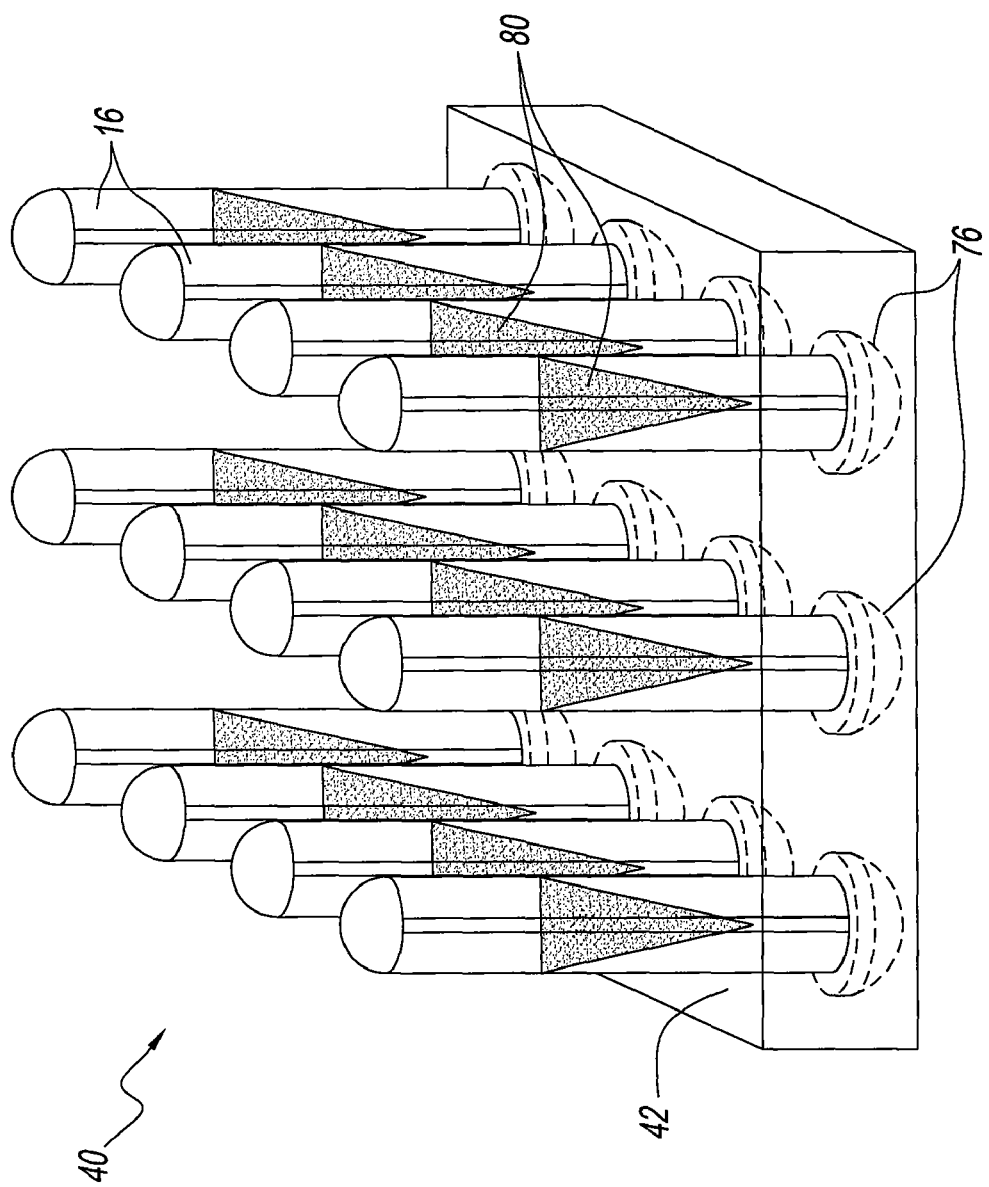
FIG. 11 illustrates a array of pins that interface with sensor element array of FIGS. 8*a* and 8*b*.

Referring now to FIGS. 8*a* and 8*b*, the sensor elements disclosed above can be arranged, as previously alluded to, in a two-dimensional matrix or array 26, with the drive rings 18 connected together along one array axis, and the sense rings 20 connected together along the other array axis. FIG. 11, to be discussed in detail below, shows an array of pins 40 that function cooperatively with array 26, so that a plurality of positions of pins 16 can be sensed using arrays 26 and 40. Drive rings 18 are shown as being connected together in rows, and the sense rings connected together in columns. Then if M rows and N columns are used, it is seen that one of the great advantages of this design is that M times N sensor elements are accommodated by using only M drive pulse sources and N sense amplifiers. The sense devices 12 are etched patterns with holes drilled in the printed circuit board, so they can be inexpensively mass-produced. No special electronic circuitry is required, as in the prior art, at each sensor location, so a substantial cost saving can result. For the case of 16 rows and 36 columns, a total of 576 separate locations can be sensed and still require only 52 independent signals and sets of circuitry. Sense devices 12 are arranged in a uniformly spaced rectangular array with a spacing of 0.315 inch between centers in both row and column directions. With the ring outside diameter of 0.290 inch, this gives a clearance space of 0.025 inch between the outside diameters of rings in adjacent columns.

With regard to FIG. 8a and FIG. 8b, during experimental measurements of prototype sensor elements, it was discovered that having the sensor rings closely spaced as above could lead to significant cross-coupling between adjacent columns. Specifically, if a signal were induced in one column by an active sensor, the columns adjacent to it on either side could have induced signal amplitude of 3.7 percent of the signal on the active column. Because the sensor operation is essentially analog, and distance measurements will be made according to when the sensor output crosses a reference threshold, this could cause errors in the measured distance values. This effect is possible on the sense ring side of the sense devices 12 because the sense amplifier chosen for economic reasons permits significant signal voltage to be developed on each column line. Stray coupling on the row drive side between rings is not of importance since the row drive signals come from a low impedance source, and the row lines are loaded with additional bypass capacitors. If an additional amplifier with a low input impedance were used for each column, then the parasitic coupling would have no effect as there would not be any signal voltage on the column lines. The experimentally chosen method to reduce this undesirable effect is to place a thin, grounded metal trace connection 30 on the surface of the printed circuit board. Trace connection 30 is placed between the ring edges of adjacent sensor ring columns. With a clearance space of 0.025 inch available, this shielding trace reduces the induced parasitic coupling to less than 1.6 percent, which was judged acceptable for this application.

Figure 2:
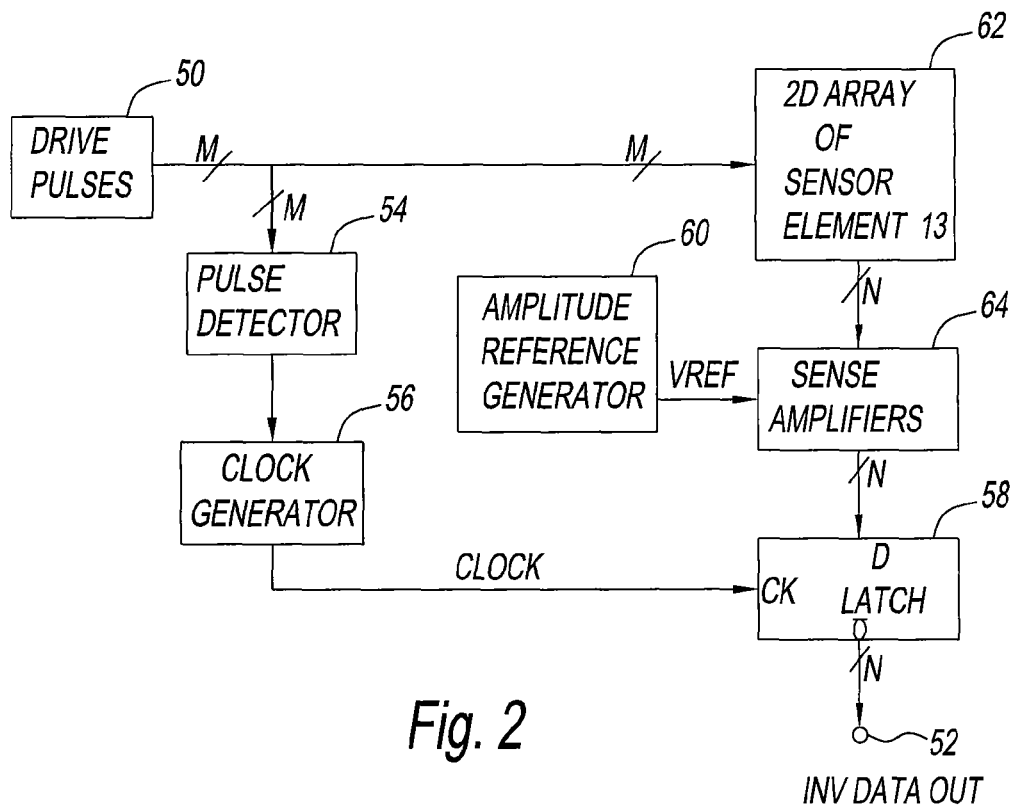
FIG. 2 is a block diagram of the electrostatic system for sensing the locations of the active sensor devices.

FIG. 2 is a block diagram of a system of sense devices 12. An external source of drive pulses 50 sends 10 volt amplitude pulses of 3 to 500 microsecond duration to the M rows of the sensor element matrix 62, one row at a time. The circuitry provided senses the presence or absence of a conducting zone, in the form of a shaped conductive zone 80 on pin 16 (FIG. 10), in each sensor location in a given row, and outputs that data on the N digital column outputs 52. Operation begins when the pulse detector determines that a pulse has occurred on one of the M input row lines. The pulse detector triggers a clock pulse generator 56, and the trailing edge of the clock pulse will be used to store the results of the sensing operation in a latch 58. An amplitude reference generator 60 produces a voltage output VREF during the pulse input that is controlled by the host computer. Each column from the sensor array 62 goes to an amplitude comparator, within the digital sense amplifier 64, which determines if the coupled signal from the sense ring 20 on the driven row exceeds the VREF value. If the reference value is exceeded, the corresponding digital sense amplifier 64 output goes high. Otherwise, it stays low. Finally, the separately generated clock pulse stores the sense amplifier outputs from all the columns into a latch for later use. The N columns digital outputs are held until the next row is driven with a pulse.

Figure 3:
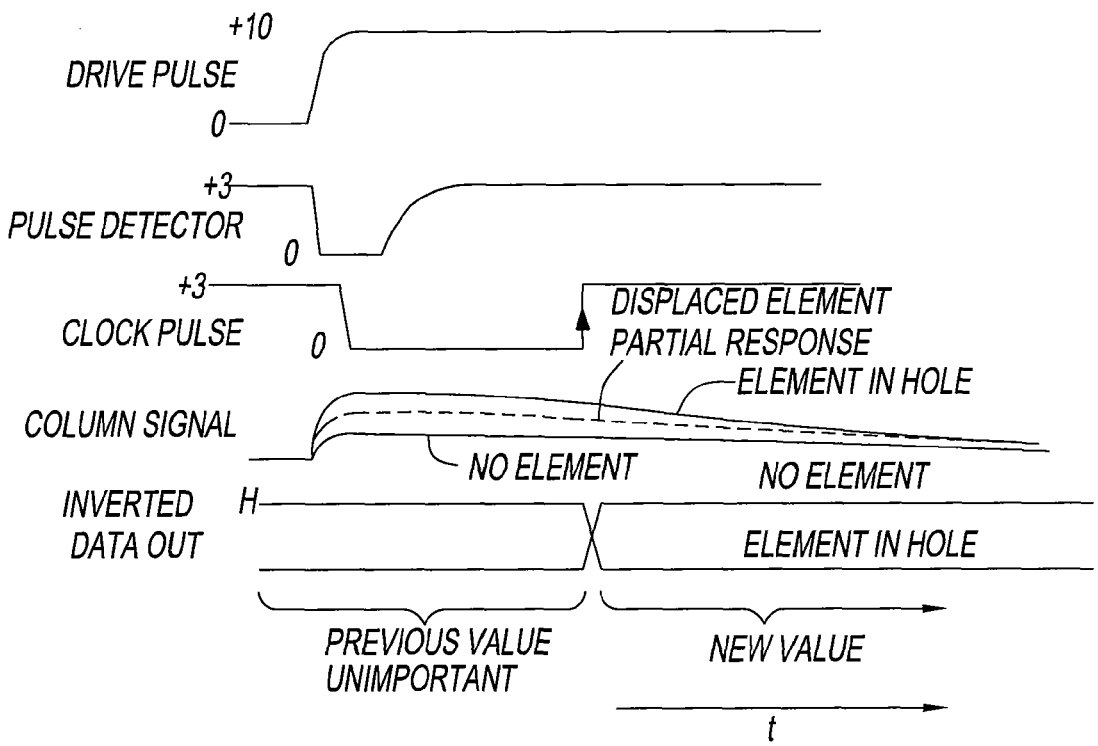
FIG. 3 is an operational timing diagram.

A timing diagram for the sensing system operation is shown in FIG. 3. Operation begins with the drive pulse rising edge, which produces an output from the pulse detector 54 and the clock pulse generator 56. The column signal is proportionate to the drive pulse and coupling capacitance at its start, and varies according to the material occupying the sense hole 14. Because the coupling capacitance is very small (typically 0.1 picofarad), the row capacitance is typically 30 picofarad, and the sense amplifiers 64 have a finite input impedance of 470 kilohms, the column signal decays to zero with a time constant of about 15 microseconds. For this reason, the digital output of the sense amplifiers must be saved in a latch for later use. The clock pulse occurs about 2 microseconds after the drive pulse rising edge to do this data storage. No data is altered at the trailing edge of the drive pulse, although there is a signal coupled into the column lines. Normally the drive pulses will have their width established such that the response caused by the trailing edge of one pulse will not interfere with the desired response from the leading edge of a following pulse. More than one pulse may be high at a time without causing problems because of the 15 microsecond time constant being short in relation to the drive pulse width.

In the above description, the value of the reference voltage (VREF) is preferably by a computer controlled voltage source. A suitable voltage source would be a digital-to-analog converter (DAC). This type of device typically puts out a voltage proportional to a digital control word input, a collection of binary bits. In this way, the host control computer can vary the value of the voltage VREF and observe the sensing system response at each pin location. By iterative process, the value of VREF can be found which just causes a digital output response for a particular pin location and position, and therefore a digital number equivalent to each sensing pin location can be determined. This set of numbers can then be assembled into a data array representing the relative displacements of each of the sensing pins in the system. At a later time, mathematical operations can refine this digital data to determine linearized pin location data.

Figure 4:
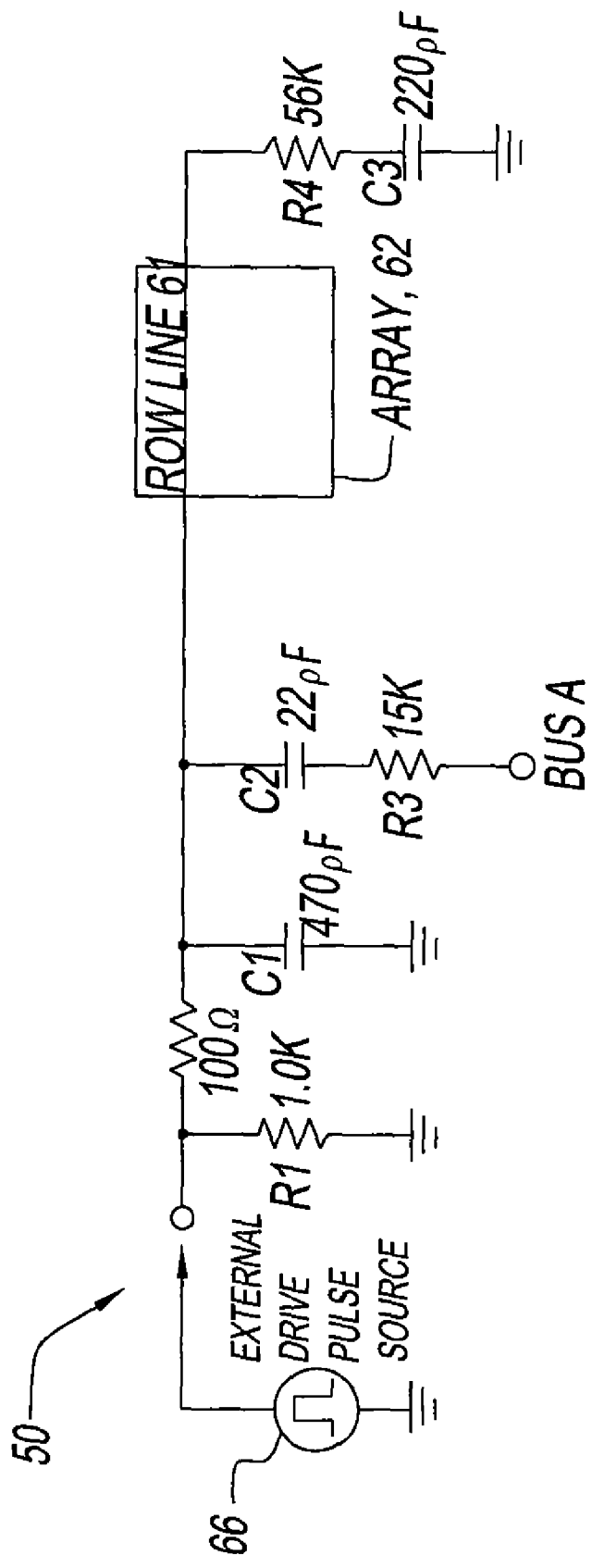
FIG. 4 is a schematic diagram of an array drive circuit for driving the X-Y array of sensor elements.

Each of the drive lines for the 16 row by 36 column sensor array has a circuit similar to the circuit schematic diagram shown in FIG. 4. The external drive pulse source can be represented as a voltage source 66 with its output going between 0 volts and +10 volts, and having a rise time of 100 nanoseconds and a fall time of 300 nanoseconds. This voltage source has an output impedance of less than 10 ohms. The drive pulse goes first to R1, a 1.0K resistor to ground. This causes the drive line to go to ground if not connected, and puts a minimum load on the drive pulse source for better performance. It then goes through R2, a 100 ohm resistor in series with the array line. This limits the driver current output if a short occurs elsewhere in the circuit. In addition R2 acts in conjunction with C1, a 470 pF capacitor as a low pass filter to limit high frequency noise from the drive pulse source being put on the drive line. The voltage on C1 then drives the row line in the sensor array. At the far end of the sensor array, the row line 61 is terminated in a series combination of R4, 56 ohms, and C3, 220 pF. This serves to terminate high frequency waveforms in a load similar to the characteristic impedance of the trace structure for the drive rings 18 and connecting traces 30.

In addition to the above, each row line 61 has connections to bus A through a series combination of C2, 22 pF, and R3, a 15K resistor. This injects an impulse of charge into bus A whenever a row line makes a transition. A separate circuit described later uses the bus A signal to detect that a row pulse has occurred.

Each row line M in the sensor array 26 has a total capacitance to the remaining circuitry of about 60 pF, for 36 drive rings 18 and interconnecting traces. The transmission line surge impedance of this row line is approximately 56 ohms when constructed on FR4 epoxy-fiberglass printed circuit board material of $\frac{1}{16}$ inch thickness.

Figure 5:
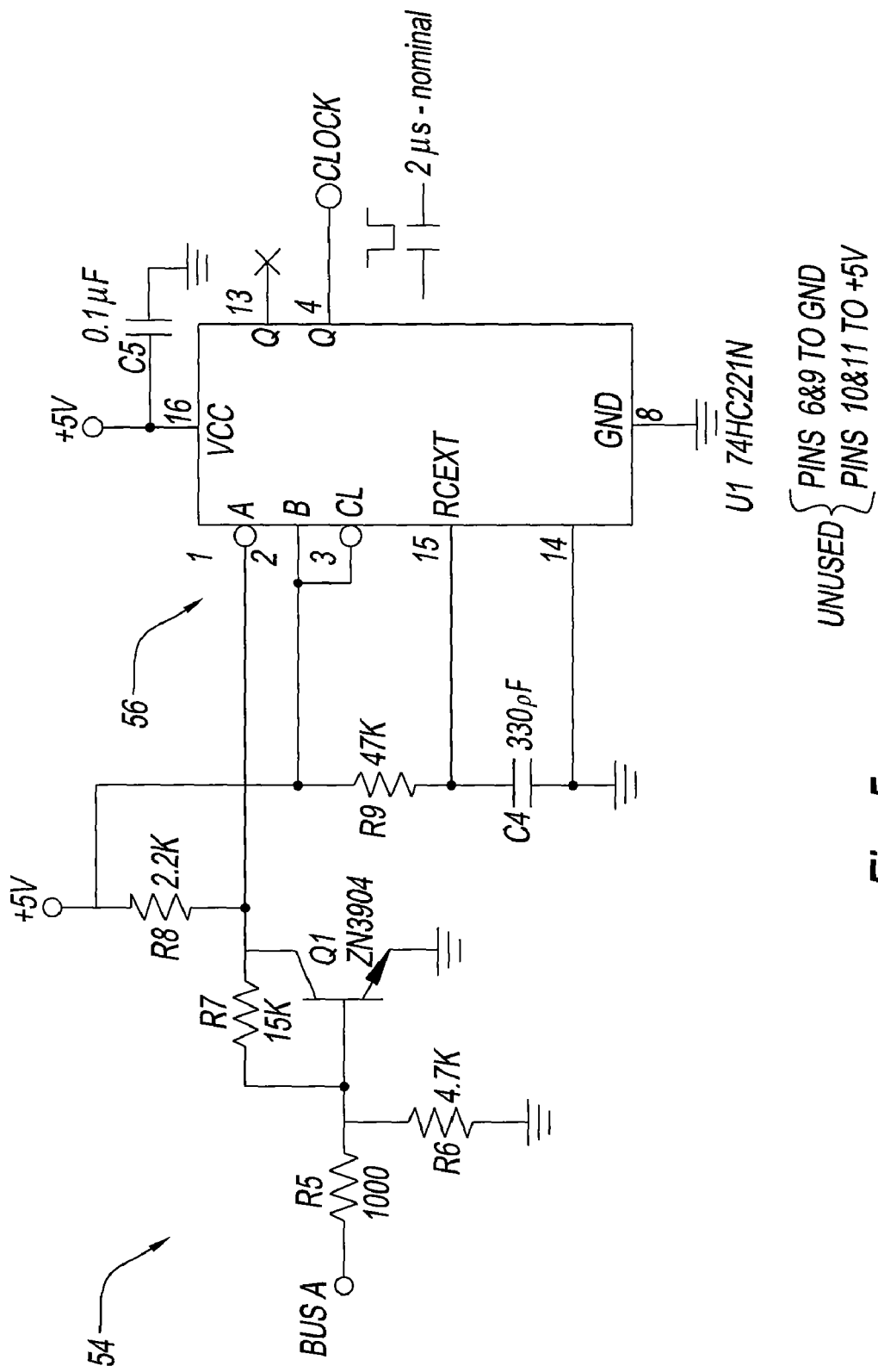
FIG. 5 is a schematic diagram of a pulse detector and clock generator, seen in FIG. 2, that are connected to the array drive circuit.

FIG. 5 shows the pulse detector 54 and clock generator 56 circuits. The input charge pulses caused by the row drive inputs go through a series resistor R5, 100 ohms, to the base of transistor Q1, a 2N3904 general purpose silicon amplifier. Resistor R8, 2.2K, serves as the load resistor for Q1 to cause it to operate as an amplifier, with resistor R7, 15K, providing feedback. Resistor R6, 4.7K, establishes the bias operating point so that the collector voltage will be about 4 times the value of Vbe for the silicon transistor. At room temperature with typical parts, this gives a quiescent voltage on the transistor collector of about +2.8 volts DC. When a +10 volt row line positive transition occurs, the charge coupled through C2 and R3 previously shown causes the transistor to saturate with its collector at about +0.1 volt. This saturation state remains for 700 nanoseconds, and the collector then returns to its quiescent voltage of +2.8 volts with a time constant of 30 nanoseconds. The falling edge of the voltage at the Q1 collector is connected to the A input of the monostable multivibrator U1, causing it to begin outputting a pulse. The other inputs are tied to +5 volts or ground as needed since they are not used. The output pulse width is set by the capacitor C4, 330 pF, and resistor R9, 4.7K ohms to a value of approximately 2 microseconds. The monostable output pulse is positive going at the pin Q, and goes from H to L at pin Qbar. Since the data latches used later respond to a rising edge and it is desired that they clock in data when the monostable pulse terminates, the Qbar output is used to drive the clock line to the latches. Capacitor C5, 0.1 uF, is a noise bypass for power to U1 as commonly practiced in the state of the art.

Figure 6:
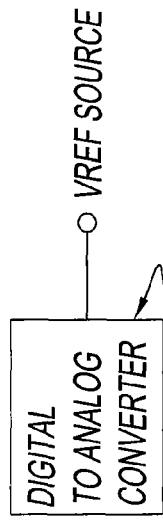
FIG. 6 is a schematic diagram of an amplitude reference generator seen in FIG. 2.
Figure 6:
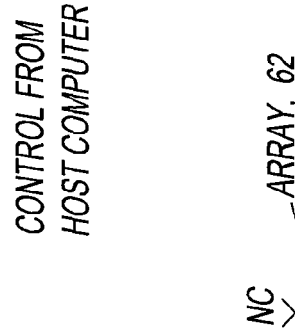

The amplitude reference generator 60 is shown in FIG. 6. This circuit uses a DAC to generate the reference voltage VREF. The DAC input is digital data from the host computer, and the output is a voltage scale as needed for use by the sense amplifiers 64 in FIG. 7. This voltage typically needs to be digitally changeable over the range of 0 to 80 millivolts according to the design parameters represented elsewhere for the sensing system. In a different system using the same principle, the DAC output would be scaled for a different magnitude of output.

The sense amplifier 64 and latch circuit 58 are shown in FIG. 7. One of the 36 column lines 63 from the sense element array of FIG. 8b is connected to a resistor R13, 470K, to ground to define the average DC signal level. It also goes to the + input of a comparator U2, a TLV23521D, which serves as the sense amplifier. The comparator is a high gain amplifier which produces a digital output which is H if the + input is more positive than the − input, and L for the reverse state. The − input of the comparator receives the VREF voltage which represents the present discrimination level. Power for the comparator is +5 volts provided to pin 8, with a 0.1 uF noise bypass capacitor C7. The ground return is pin 4. Output from the comparator is taken out on pin 1, which has a pull-up resistor R14, 10K, to +5V. The comparator output is an open drain stage, so a source of current to pull it up to a logic H level is needed. Output from the comparator also goes to the D input of the latch U3 (58), a 74AC564 octal inverting edge triggered latch, on pin 2.

The inverting form of the latch is used in this particular application so that the latched outputs will go low when a signal is received to give compatibility with other equipment. A non-inverting latch could be used to give similar results. When the clock signal from FIG. 5 makes a low to high transition on pin 11, the latch will store the present value on its D input and present it at its Qbar output on pin 19. At all other times, the value of the Qbar output is unchanged. The output enable bar for the latch on pin 1 is permanently connected to ground so the output always stays ON, since this function is not needed. Comparator U2 comes in a package with two sections. The remaining section is used for a functionally identical circuit not shown here. Latch U3 comes in a package with 8 sections, and the other sections are used for other columns not shown. A total of 18 dual comparator packages and 5 octal latch packages are used to make the circuitry for sensing and latching the outputs of 36 columns.

A portion of sensor element array 26 is shown in FIGS. 8A and 8B. Specifically, upper surface of array 26 is shown in FIG. 8a and lower surface of array 26 is shown in FIG. 8b. Array 26 is made with elements 12 as shown previously in FIG. 1 arranged in a uniformly spaced array with a center to center spacing of 0.315 inch. Array 26 has 16 rows of 36 column, with shielding ground traces 30 between each of the columns of sense rings 20 to minimize parasitic coupling. The physical sensing array has the drive circuitry at one end of the drive rows, and the sense amplifiers located at one end of the columns. The arrangement is done so as to minimize the possibility of stray signals being coupled into the column sense lines and to minimize the length of traces on the column sense lines.

Figure 9:
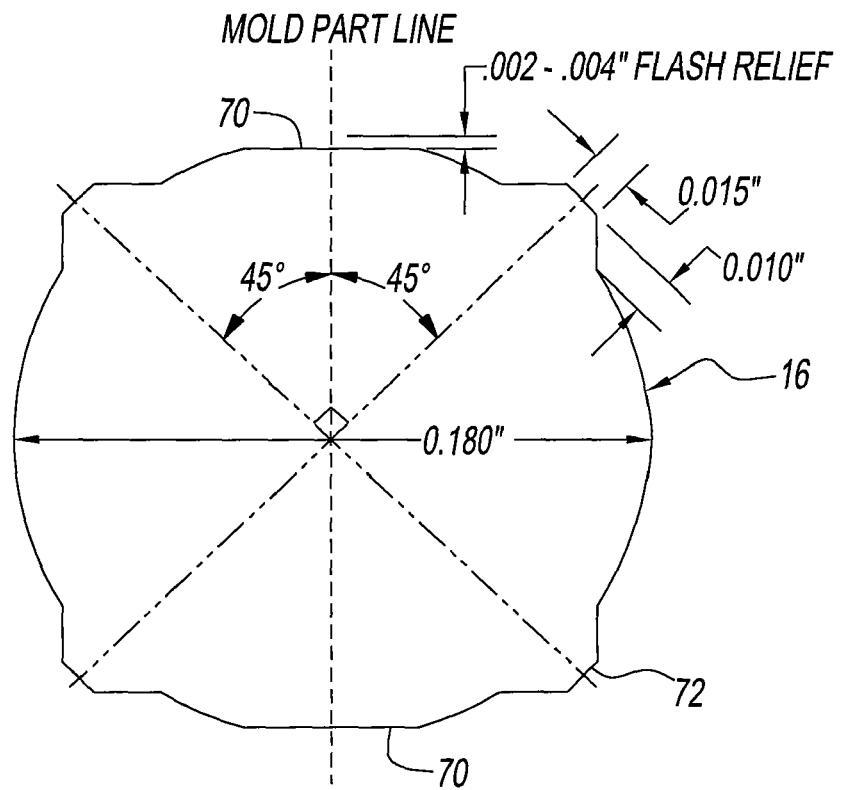
FIG. 9 is a cross-sectional view of a sensing element in the form of a pin.

A preferred form for the cooperating sense pin 16 previously alluded to will now be described. FIG. 9 shows a cross-section of the pin at any point along the constant diameter portion of its length, drawn with a magnification of 20 times. The pin is made with a nominally constant diameter of 0.180 inch for use in a sensor hole of 0.200 inch internal diameter. Two special features of the pin's cross-section are flattened sides 70 where the mold halves mate together to reduce problems with spurious mold flash protrusions, and small longitudinal ribs 72 to minimize abrasion of the cylindrical surface. The longitudinal ribs are sized so that their outermost surfaces are approximately 10 percent of the total circumference. The ribs protrude only 0.010 inch so that they enforce an air gap around the pin, but do not excessively widen the air gap. Equal spacing of the four ribs around the circumference provides support for all possible directions of abrasion. Alternative forms of pin 16 may be provided by omitting or changing the longitudinal ribs, for example.

Figure 10:
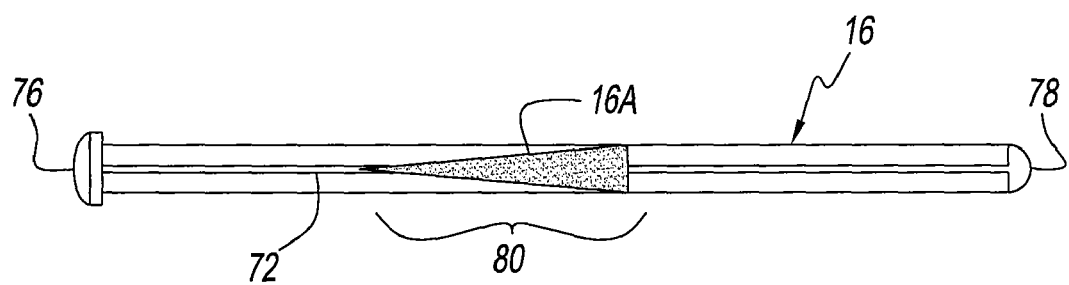
FIG. 10 is a profile view of the sensing pin.

FIG. 10 is a longitudinal view of pin 16 with one of the four longitudinal ribs detailed. At one end of the shaft, a button head 76 retains pin 16 in its equipment, preventing accidental loss of the pin. Pin 16 normally protrudes through a metal sheet with appropriate holes for sliding motion. The other end of the shaft has a rounded shape to minimize the possibility of tissue damage when pressed against a soft surface. A special molding plastic is used for fabricating pin 16 that incorporates both fiberglass for strength and PTFE for built-in lubrication. The plastic has a very low conductivity, and behaves as an excellent insulator. At a location approximately halfway between the ends of pin 16, a shaped conductive zone or region 80 of the plastic a region is made conductive with an evaporated metal coating or equivalent.

Because the sensor being used is very sensitive to electrostatic fields and draws essentially no current through the pin, the metal coating can be very thin. The sensor will work correctly for metal layers with sheet-resistances of 10,000 ohms per square or less. A layer of chromium or aluminum with a thickness of only 4 microinches gives a sheet resistance of less than 0.5 ohm per square, and is partially transparent to the eye. For sturdiness, a chrome layer of 10 to 40 microinches is desired, but from the above numbers almost any layer thickness would do. The layer could be invisible and still be effective. It is important that the pin surface not intended to have conductive properties should not receive any evaporated metal, and the transition zone from metal to clear should not extend over more than about 0.02 inch of axial length at each end of the metal region.

Pin 16 shown in FIG. 10 has a center section that is shaped to form a specifically shaped conductive zone 80. The length of the shaped conductive zone 80 reflects the desired measurement range along the length of pin 16. The varying width of shaped conductive zone 80 is required to determine pin 16 location along the longitudinal axis. There can be many different shapes to shaped conductive zone 80. Shaped conductive zone 80 needs to have a known characteristic such that when pin 16 is moved through the electrostatic sensor or placed in electrostatic sensor, its relative position can be determined. In the preferred embodiment a calibration procedure will be required to characterize the electrostatic sensors' response to the conductive area on pin 16 as it is moved longitudinally through the sensor. The values received from the sensor are stored along with actual pin position data in a processor. Software then compares the sensor values with the stored calibration value to return the relative position of pin 16. This evaluation process, if run continuously, would provide near real-time evaluation of the pin's position with regards to the sensor.

Shaped conductive zone 80 can be realized in any of a number of methods including a captive metal part that is insert molded inside pin 16, a metal spring that is formed such that it snaps in place or is adhered on the outside of pin 16, a metalized region on pin 16, or a dual molded plastic part with one component being more conductive than the other.

The longitudinal ribs are now seen to serve the purpose of keeping motion of the pin in the sensing hole from rubbing the thin metal layer off of the surface of the pin. Friction will remove metal from the tops of the ribs, but they constitute a small portion of the total metal circumference. The overall sensor sensitivity should drop by less than 10 percent with wear and age.

The plastic pin 16 is injection molded from a mixture of a thermosetting plastic with 15 percent of fiberglass short fibers and 15 percent of PTFE added to the mixture. The pin is treated as needed to promote adhesion of the evaporated metal, and placed in a metal evaporation system. A system of metal masks in the evaporation system prevents metal condensation on the pin anywhere except the desired region as marked in FIG. 10. The pin is then ready for use in the electrostatic sensor device Referring to FIG. 11, an array of pins 40 having pins 16 is shown. Array 40 functions cooperatively with array 26 shown in FIGS. 8a and 8b. Array 40 and array 26 function together as a plurality of electrostatic sensors to obtain surface contour of array 40. For example, pins 16 of array 40 are affixed in a support structure 42 that will maintain lateral position of pins, such as a relatively moldable yet stable foam or a mechanical receptacle. A user could place a body part, such as the plantar surface of the foot, on array 40 to depress pins in support structure. Depth of individual pins 16 depends upon weight placed on each pin 16. Any other body part or surface for which a contour is desired could also be used. By using such a support structure 42, various positions or heights of pins 16, and in particular, variable regions 16a of each pin 16 is maintained in array 40.

Figure 12:
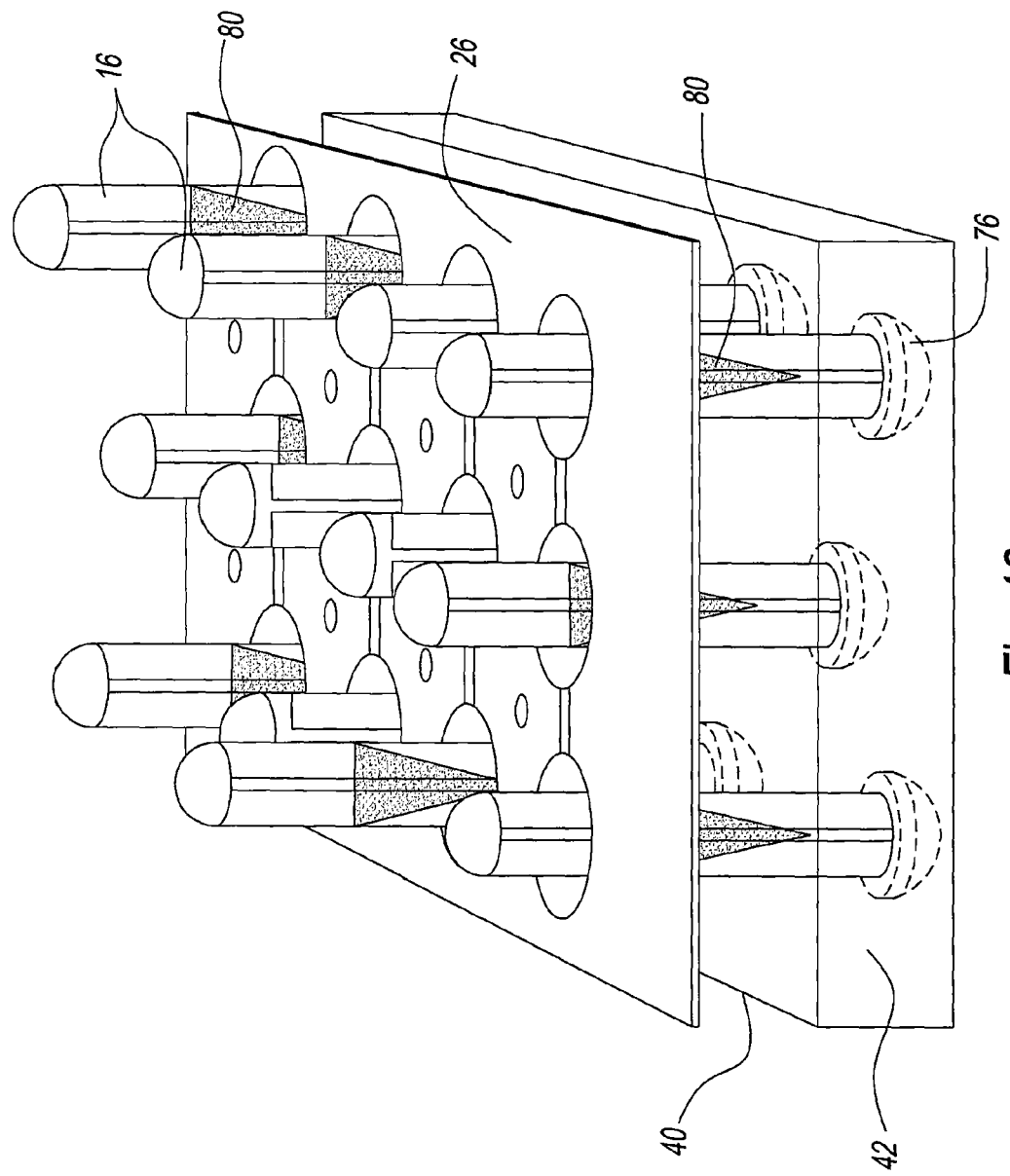
FIG. 12 illustrates an array of pins that are interfacing with a sensor element array of FIGS. 8*a* and 8*b*.

Referring to FIG. 12, when array 40 is positioned in array 26, measurements can be taken after drive pulses are applied to sensors. FIG. 12 shows a plurality of pairs of sensors. Each pair of sensors has components associated with array 26, namely drive ring 18 and sense ring 20 and pin 16 associated with array 40. When a pulse is applied to array of pins 40 and array 26, responses that are measured for each pin 16 are proportional to the amount of conductive material on shaped patterns 16a of each pin 16. Because shaped patterns 16a will be at different heights, and measurements or responses would be proportional to amount conductive material within each sensing ring 14 on array 26 for each pin 16 at such different heights.

As discussed previously, the shaped conductive zone 80 has a known characteristic and its relative position can be determined. In the preferred embodiment a calibration procedure will be required to characterize the electrostatic sensors' response to the conductive area on pin 16 as it is moved longitudinally through the sensor. The values received from the sensor are stored along with actual pin position data in a processor. Software then compares the sensor values with the stored calibration value to return the relative position of pin 16. This evaluation process, if run continuously, would provide near real-time evaluation of the pin's position with regards to the sensor.

The advantage of the shaped conductive zone 80 on pins 16 is that additional machinery is not required to move pins 16 of array 40 relative to sensing holes 14 of array 26 during the measurements. The measurements can be taken after pins 16 have been displaced on support structure 42. Only software interaction between computer and measurement electronics are required to effect measurements.

It should be understood that the foregoing description is only illustrative of the invention. Various alternatives and modifications can be devised by those skilled in the art without departing from the invention. Accordingly, the present invention is intended to embrace all such alternatives, modifications, and variances, which fall within the scope of the appended disclosure.

We claim:

1. An electrostatic sensor device comprising:
 a first sensor element and a second sensor element;
 a dielectric substrate material formed in two layers,
 a sensing hole which penetrates the dielectric substrate material from its upper surface to its lower surface,
 said first sensor element being receivable in said sensing hole; and wherein said first sensor element comprises a conductive zone that contains conductive material, and wherein said conductive zone contains portions that are covered by said conductive material and portions that are not covered by said conductive material; and
 said second sensor element comprising a first conducting ring disposed on an upper surface of said dielectric substrate and surrounding said sensing hole and second conducting ring disposed on a lower surface of said dielectric substrate and surrounding said sensing hole
 wherein said first sensor element and said second sensor are capable of producing variable responses that are proportional to said portions of said conductive zone that are covered by said conductive material in said sensing hole when said first sensor element is disposed at different positions in said sensing hole.

2. The device as defined in claim 1, further comprising a signal source connected to the first conducting ring and a sensing circuit connected to the second conducting ring.

3. The device as defined in claim 1, wherein the first sensor element is a dielectric pin, such that when the pin is disposed in the sensing hole and a pulse is applied to the first conducting ring, a signal is transmitted by the sensing circuit connected to the second conducting ring that is proportional to the portions of the conductive zone that are covered by said conductive material.

4. The device as defined in claim 1, wherein the inner peripheries of the first and second conducting rings are not exposed on the interior surface of the sensing hole.

5. The device as defined in claim 1, wherein said dielectric substrate material further comprises a conducting plane between the two layers; and a clearance hole in the conducting plane such that the conducting plane does not obstruct the sensing hole.

6. A system for electrostatically measuring the shape or pattern of objects comprising:
- an array of sensor devices comprising sensor device pairs, wherein each of said sensor device pairs comprises a first sensor element and a second sensor element, and wherein said first sensor element comprises a conductive zone that contains conductive material, and wherein said conductive zone contains portions that are covered by a conductive material and portions that are not covered by a conductive material; said array of sensor devices having the capability of responding, due to variable electrostatic coupling, to produce differentiated output signals when said first sensor element of each of said sensor device pairs are at varying positions relative to said second sensor element of said sensor device pairs, wherein said array includes M rows and N columns of sensor devices;
- a source of drive pulses connected to the M rows;
- a detector for determining that a pulse has occurred on one of the M input rows;
- a clock generator connected to the detector;
- sense amplifiers in the N columns for sensing the output signals from the sensor devices; and
- an amplitude reference generator connected to the M rows for providing an adjustable computer controlled reference voltage such that if the reference value is exceeded, the respective sense amplifier output changes state.

7. The system as defined in claim 6, wherein the position of said first sensor element of said sensor device pairs, defines the shape or pattern of the objects being measured.

8. The system as defined in claim 6, wherein the first sensor element in each of said pairs of sensor device pairs is a dielectric pin and a second sensor element is a first conducting ring and a second conducting ring, such that when the pin is disposed within said second sensing element, and a pulse is applied to the first conducting ring, a response that is received by said second conducting ring is proportional to the portions of the conductive zone that are covered by said conductive material within said second sensing element.

9. The system as defined in claim 6, further comprising latches connected to the respective sense amplifiers for storing the sense amplifier outputs from all the columns.

10. The system as defined in claim 6, further comprising grounded shield traces between the N columns.

11. The system of claim 6, wherein said first sensor element of said sensor device pairs of said array are secured in a structure that is able to maintain a contour of a surface against which such first sensor elements have been placed.

12. The system of claim 6, wherein each sensor device pair of said array of sensors produces a signal proportional to an amount of conductive material in the conductive zone of the pin in said sensing hole.

* * * * *